United States Patent
Lee et al.

(10) Patent No.: US 7,208,808 B2
(45) Date of Patent: Apr. 24, 2007

(54) MAGNETIC RANDOM ACCESS MEMORY WITH LOWER SWITCHING FIELD

(75) Inventors: Yuan-Jen Lee, Hsinchu (TW);
Yung-Hsiang Chen, Hsinchu (TW);
Wei-Chuan Chen, Hsinchu (JP);
Ming-Jer Kao, Hsinchu (TW);
Lien-Chang Wang, Hsinchu (TW)

(73) Assignee: Industrial Technology Research Institute, Chu-Tung, Hsinchu (TW)

( * ) Notice: Subject to any disclaimer, the term of this patent is extended or adjusted under 35 U.S.C. 154(b) by 0 days.

(21) Appl. No.: 11/159,137

(22) Filed: Jun. 23, 2005

(65) Prior Publication Data

US 2006/0102971 A1 May 18, 2006

(30) Foreign Application Priority Data

Nov. 16, 2004 (TW) ............... 93135086 A

(51) Int. Cl.
*H01L 29/82* (2006.01)
*H01L 43/00* (2006.01)
*H01L 27/14* (2006.01)
*H01L 29/84* (2006.01)
*H01L 31/111* (2006.01)

(52) U.S. Cl. .................. 257/421; 257/108; 257/414; 257/422; 257/423; 257/424; 257/425; 257/426; 257/427; 257/659

(58) Field of Classification Search ............... 257/108, 257/414, 421–427, 659
See application file for complete search history.

(56) References Cited

U.S. PATENT DOCUMENTS

| | | | | |
|---|---|---|---|---|
| 6,201,671 B1 * | 3/2001 | Pinarbasi | ............... | 360/324.11 |
| 6,335,081 B1 * | 1/2002 | Araki et al. | ................. | 428/141 |
| 6,728,132 B2 | 4/2004 | Deak | | |
| 6,738,237 B2 * | 5/2004 | Gill | ......... | 360/324.11 |
| 6,888,703 B2 * | 5/2005 | Dieny et al. | ................. | 360/324 |
| 6,917,088 B2 * | 7/2005 | Takahashi et al. | .......... | 257/422 |
| 2002/0181169 A1 * | 12/2002 | Pinarbasi | ............... | 360/324.11 |
| 2004/0061983 A1 * | 4/2004 | Childress et al. | ......... | 360/324.2 |
| 2004/0136120 A1 * | 7/2004 | Hayakawa et al. | ....... | 360/324.2 |
| 2004/0136121 A1 * | 7/2004 | Mao et al. | ............. | 360/324.11 |
| 2004/0175847 A1 * | 9/2004 | Fricke et al. | ................... | 438/3 |
| 2004/0196681 A1 * | 10/2004 | Xiao et al. | ................... | 365/145 |
| 2004/0246776 A1 * | 12/2004 | Covington | .................. | 365/173 |
| 2004/0257717 A1 * | 12/2004 | Sharma et al. | ........... | 360/324.2 |
| 2005/0045913 A1 * | 3/2005 | Nguyen et al. | ............. | 257/200 |
| 2005/0118458 A1 * | 6/2005 | Slaughter et al. | ........... | 428/692 |
| 2005/0145909 A1 * | 7/2005 | Giebeler et al. | ............ | 257/295 |
| 2005/0185454 A1 * | 8/2005 | Brown et al. | ................ | 365/171 |
| 2006/0012926 A1 * | 1/2006 | Parkin | ..................... | 360/324.2 |
| 2006/0017081 A1 * | 1/2006 | Sun et al. | .................... | 257/295 |
| 2006/0018057 A1 * | 1/2006 | Huai | ........................ | 360/324.2 |
| 2006/0028862 A1 * | 2/2006 | Min et al. | .................... | 365/158 |

* cited by examiner

*Primary Examiner*—Ida M. Soward
(74) *Attorney, Agent, or Firm*—Birch, Stewart, Kolasch, and Birch, LLP

(57) ABSTRACT

A magnetic random access memory with lower switching field is provided. The memory includes a first antiferromagnetic layer, a pinned layer formed on the first antiferromagnetic layer, a tunnel barrier layer formed on the pinned layer, a ferromagnetic free layer formed on the tunnel barrier layer, and a multi-layered metal layer. The multi-layered metal layer is formed by at least one metal layer, where the direction of the anisotropy axis of the antiferromagnetic layer and the ferromagnetic layer and that of the ferromagnetic free layer are arranged orthogonally. The provided memory has the advantage of lowering the switching field of the ferromagnetic layer, and further lowering the writing current.

6 Claims, 6 Drawing Sheets

# MAGNETIC RANDOM ACCESS MEMORY WITH LOWER SWITCHING FIELD

This application claims the benefit of Taiwan Patent Application No. 93135086, filed on Nov. 16, 2004, which is hereby incorporated by reference for all purposes as if fully set forth herein.

BACKGROUND OF THE INVENTION

1. Field of Invention

The invention relates to a magnetic random access memory and, in particular, to a magnetic random access memory that has a lower switching field and power consumption in the ferromagnetic free layer.

2. Related Art

The magnetic random access memory (MRAM) is a type of nonvolatile memory. It utilizes the magnetoresistance property to record information and has the advantages of non-volatility, high density, high read/write speed, and anti-radiation. When writing data, a commonly used method is to use the intersection of the induced magnetic fields of two circuit lines, the bit line and the write word line, to select a cell. Its resistance is modified by changing the magnetization of a ferromagnetic free layer. When the MRAM reads recorded data, a current is supplied to the selected magnetic memory cell to read its resistance, thereby determining the corresponding digital value.

The magnetic memory cell between the bit line and the write word line is a stacked structure of a multi-layered metal material. It consists of a stack of a soft ferromagnetic layer, a tunnel barrier layer, a hard ferromagnetic layer, an antiferromagnet layer, and a nonmagnetic conductor. Controlling the magnetizations of the upper and lower layers of the tunnel barrier layer to be parallel or anti-parallel can determine the memory state to be "0" or "1".

As the magnetic memory is designed to have a high density, the size of the memory cell should be decreased. This requires increase in the magnetic field for switching the magnetization of the ferromagnetic free layer, increasing the provided current. The large current makes the circuit design or the driver circuit design more difficult.

To solve the large current problem, most people adopt the means of changing magnetic memory cells so that their shape is closer to a circle. Although this method can reduce the switching field of the ferromagnetic free layer, the switching behavior of the magnetization of the ferromagnetic free layer becomes very complicated.

The U.S. Pat. No. 6,728,132 also discloses a solution. It primarily solves the discontinuous switching behavior of the magnetization vector of the ferromagnetic free layer. The ferromagnetic free layer is covered by a non-magnetic metal layer and a ferromagnetic layer. By adjusting the thickness of the metal layer, the magnetization vector of the ferromagnetic free layer and the covering ferromagnetic layer are anti-parallel to each other, forming closed magnetic field. However, it has limited effect to lowering the switching field of the ferromagnetic free layer.

As the capacity and density of memory both become larger, the write-in current needed by the magnetic memory also increases due to the structure of the magnetic memory cells. This imposes some difficulty in circuit designs. Therefore, it is necessary to provide a novel magnetic memory cell structure with a lower write-in current.

SUMMARY OF THE INVENTION

In view of the foregoing, an objective of the invention is to provide a MRAM with a lower switching field to solve the existing problems.

The disclosed MRAM with a lower switching field can lower the switching field of the ferromagnetic free layer.

The disclosed MRAM with a lower switching field can lower the data write-in current.

To achieve the above objectives, the disclosed MRAM includes a first antiferromagnet layer, a pinned layer formed on the first antiferromagnet layer, a tunnel barrier layer formed on the pinned layer, a ferromagnetic free layer formed on the tunnel barrier layer, and a multi-layered metal layer formed on the ferromagnetic free layer.

According to the invention, the multi-layered metal layer is formed by stacking a plurality of metal layers.

According to the invention, the anisotropy axes of the ferromagnetic layer and the antiferromagnetic layer in the multi-layered metal layer are perpendicular to the anisotropy axis of the ferromagnetic free layer.

According to the objective of the invention, the disclosed MRAM with a lower switching field has the advantages of lowering the switching field of the ferromagnetic free layer.

According to the objective of the invention, the disclosed MRAM with a lower switching field has the advantages of lowering the data write-in current.

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
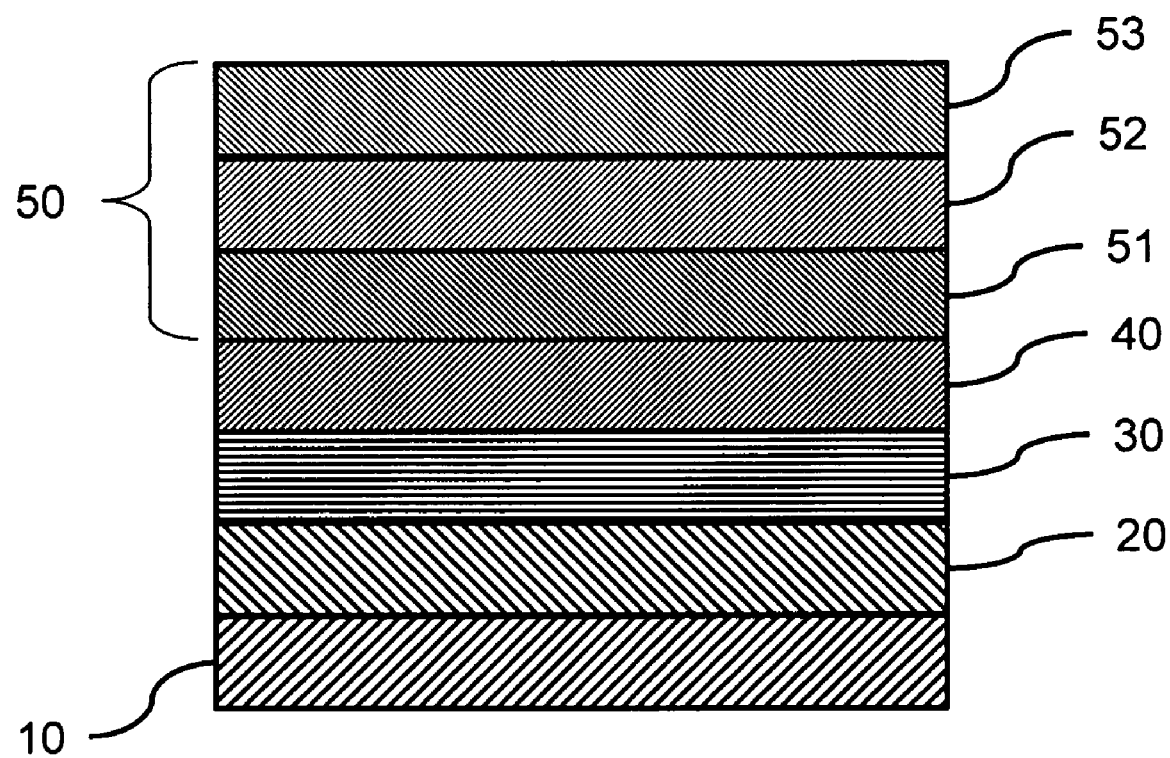
FIG. 1 shows the MRAM of the invention.

Reference will now be made in greater detail to a preferred embodiment of the invention, an example of which is illustrated in the accompanying drawings. Wherever possible, the same reference numerals will be used throughout the drawings and the description to refer to the same or like parts. Reference in the specification to "one embodiment" or "an embodiment" means that a particular feature, structure, or characteristic described in connection with the embodiment is included in at least one embodiment of the invention.

The appearances of the phrase "in one embodiment" in various places in the specification are not necessarily all referring to the same embodiment.

FIG. 1 shows the simplified cross-sectional view of a disclosed MRAM. The drawing also shows a single MRAM (or memory cell). The actual MRAM array can be composed of several MRAM's shown in FIG. 1.

The magnetic memory cell in the disclosed MRAM is comprised of a first antiferromagnetic layer 10, a pinned layer 20 formed on the first antiferromagnetic layer 10, a tunnel barrier layer 30 formed on the pinned layer 20, a ferromagnetic free layer 40 formed on the tunnel barrier layer 30, and a multi-layered metal layer 50 formed on the ferromagnetic free layer 40.

The first antiferromagnetic layer 10 is made of an antiferromagnetic material, such as PtMn and IrMn.

The pinned layer formed on the first antiferromagnetic layer 10 can be an artificial antiferromagnetic layer formed using more than one ferromagnetic layer or in a three-layer structure. The artificial antiferromagnetic layer can be formed by stacking in sequence ferromagnetic materials, non-magnetic metals, and ferromagnetic materials and making the magnetization of the two ferromagnetic layers antiparallel. For example, one may choose CoFe/Ru/CoFe or CoFe/Cu/CoFe.

The material of the tunnel barrier layer 30 formed on the pinned layer can be, for example, AlOx or MgO.

The ferromagnetic free layer 40 formed on the tunnel barrier layer 30 can be an artificial ferromagnetic free layer formed using more than one ferromagnetic layer or in a three-layer structure.

The materials listed above are only examples of the invention. Any person skilled in the field can readily find other magnetic materials with the same effects.

The multi-layered metal layer 50 is made of more than one stacked metal layer. For example, it can consist of a non-magnetic metal layer 51, a ferromagnetic layer 52 formed on the non-ferromagnetic layer 51, and a second antiferromagnetic layer 53 formed on the ferromagnetic layer 52.

The non-magnetic metal layer 51 is made of a non-magnetically conductive material, such as Cu, Ru, and Ag. The ferromagnetic layer 52 is made of a ferromagnetic material, such as Fe, Co, Ni, CoFe, and CoFeB. The second ferromagnetic layer 53 is made of an antiferromagnetic material, such as RtMn, IrMn, and CoO. The above-mentioned materials are only examples of the invention. Any person skilled in the field can readily find other magnetic materials with the same effects.

Figure 2:
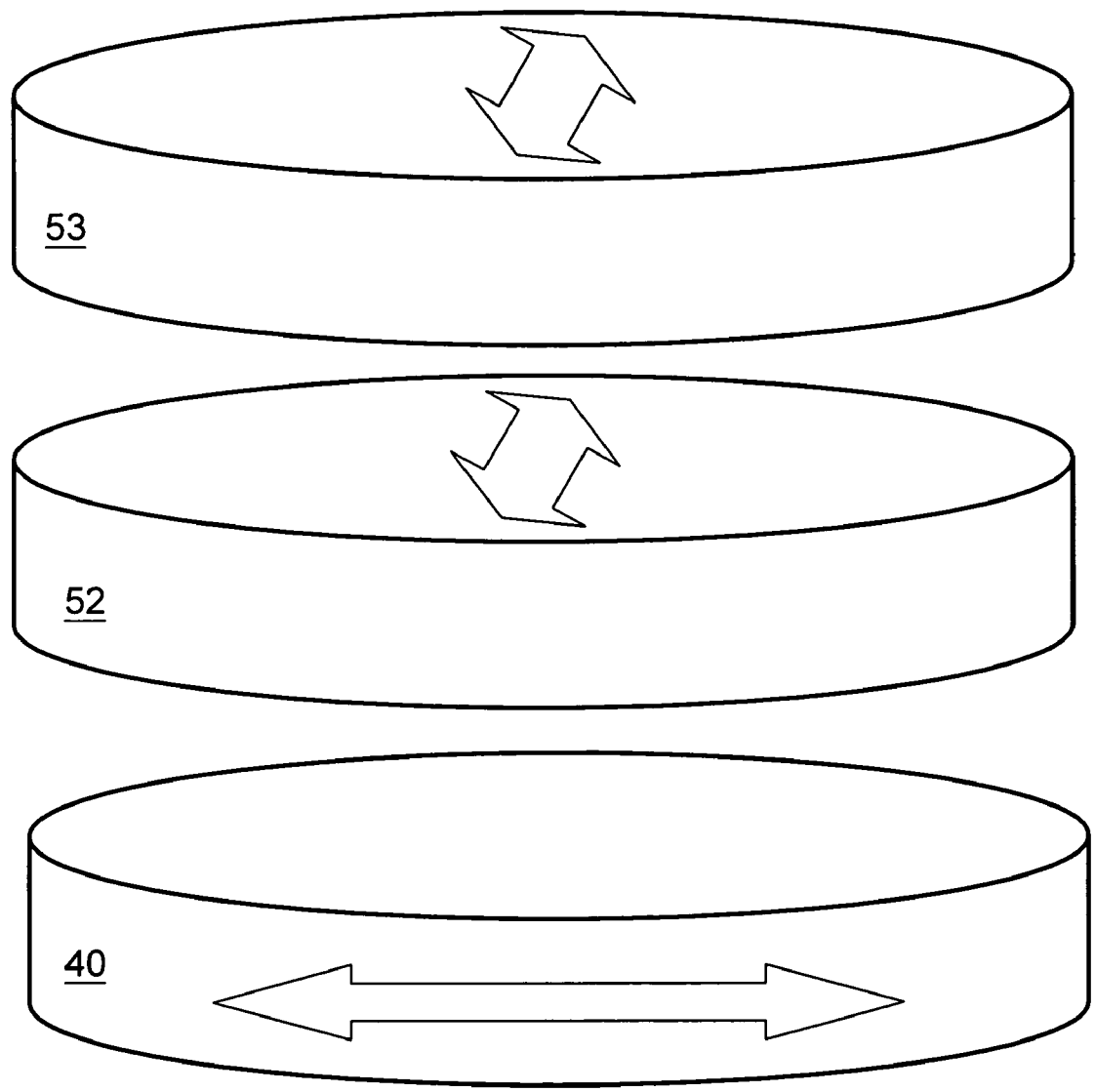
FIG. 2 is a schematic view of the anisotropy axis of the disclosed MRAM.

With reference to FIG. 2, the shape and thickness of each layer of the disclosed MRAM are not drawn to scale and should not be used to restrict the embodiments of the invention. As shown in the drawing, the anisotropy axes of the ferromagnetic layer 52 and the second antiferromagnetic layer 53 in the multi-layered metal layer 50 are perpendicular to the anisotropy axis of the ferromagnetic free layer 40.

As to the manufacturing process, the disclosed MRAM with a lower switching field can be prepared using the normal semiconductor processes. It should be emphasized that during the manufacturing process, the anisotropy axes of the ferromagnetic layer 52 and the second antiferromagnetic layer 53 covering the ferromagnetic free layer 40 are orthogonal to the anisotropy axis of the ferromagnetic free layer 40.

In practice, this can be achieved using two annealing processes. During the first annealing, a large magnetic field is imposed along the direction of the anisotropy axis of the magnetic memory cell. A smaller magnetic field is added during the second annealing along the hard axis of the magnetic memory cell. The first antiferromagnetic layer 10 and the second antiferromagnetic layer 53 in the metal layer 50 use different material or films of the same material but in different thicknesses.

In the following, we describe the principles of the invention. Generally speaking, the ferromagnetic free layer 40 is made of more than one ferromagnetic layer. The anisotropy axes of the ferromagnetic layer 52 and the second antiferromagnetic layer in the multi-layered metal layer 50 are orthogonal to the ferromagnetic free layer 40, as illustrated in FIG. 2. The thickness of the non-magnetic metal layer 51 in the multi-layered metal layer 50 can be adjusted. The coupling interaction among the layers generates a magnetic field with appropriate strength along the difficult axis of the ferromagnetic free layer 40. This can reduce the magnetic field required to switch the magnetization of the ferromagnetic free layer 40. Moreover, this can reduce the required write-in current.

Figure 3:
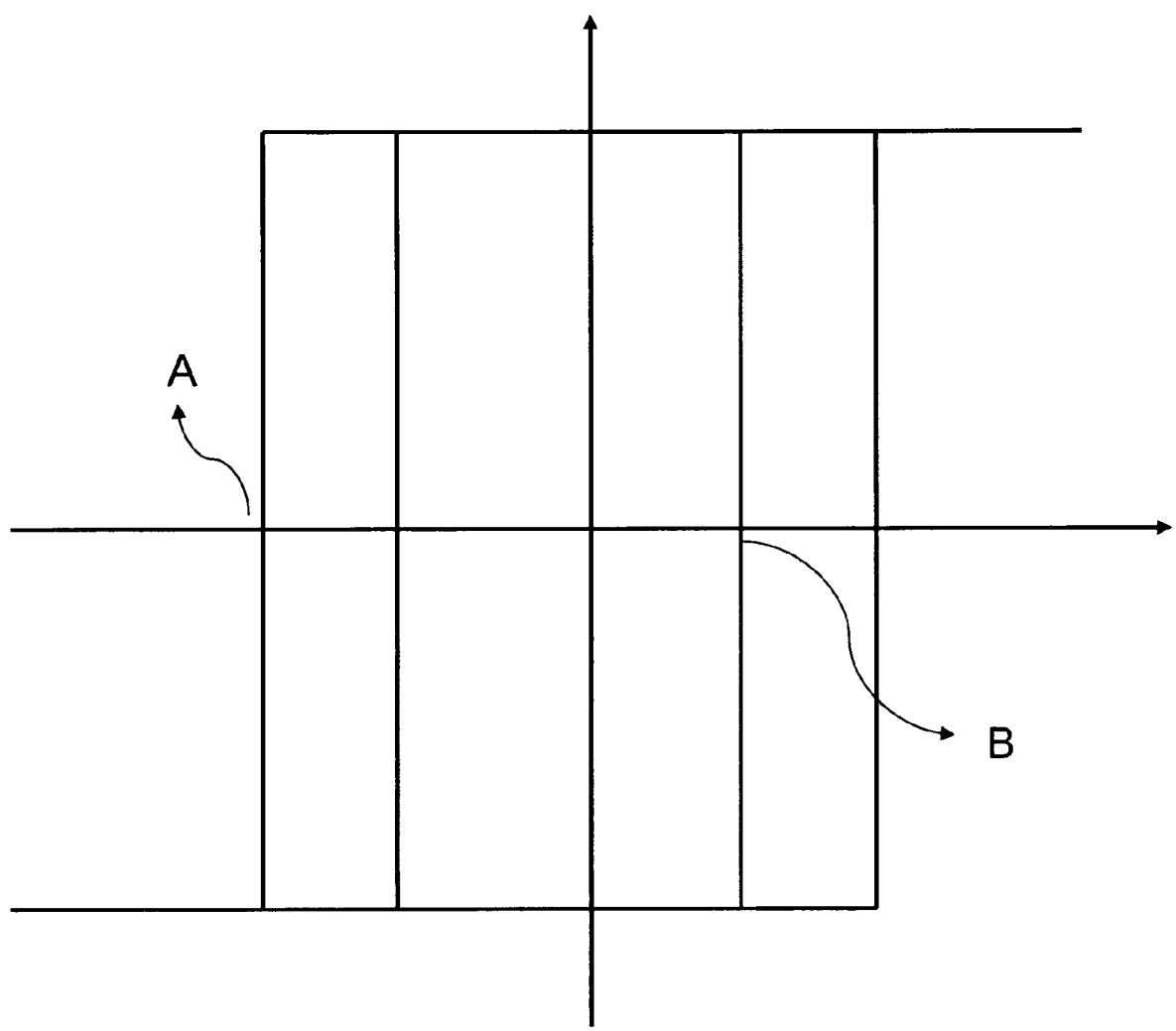
FIG. 3 is a schematic view of the hysteresis curve of the disclosed MRAM.
Figure 4:
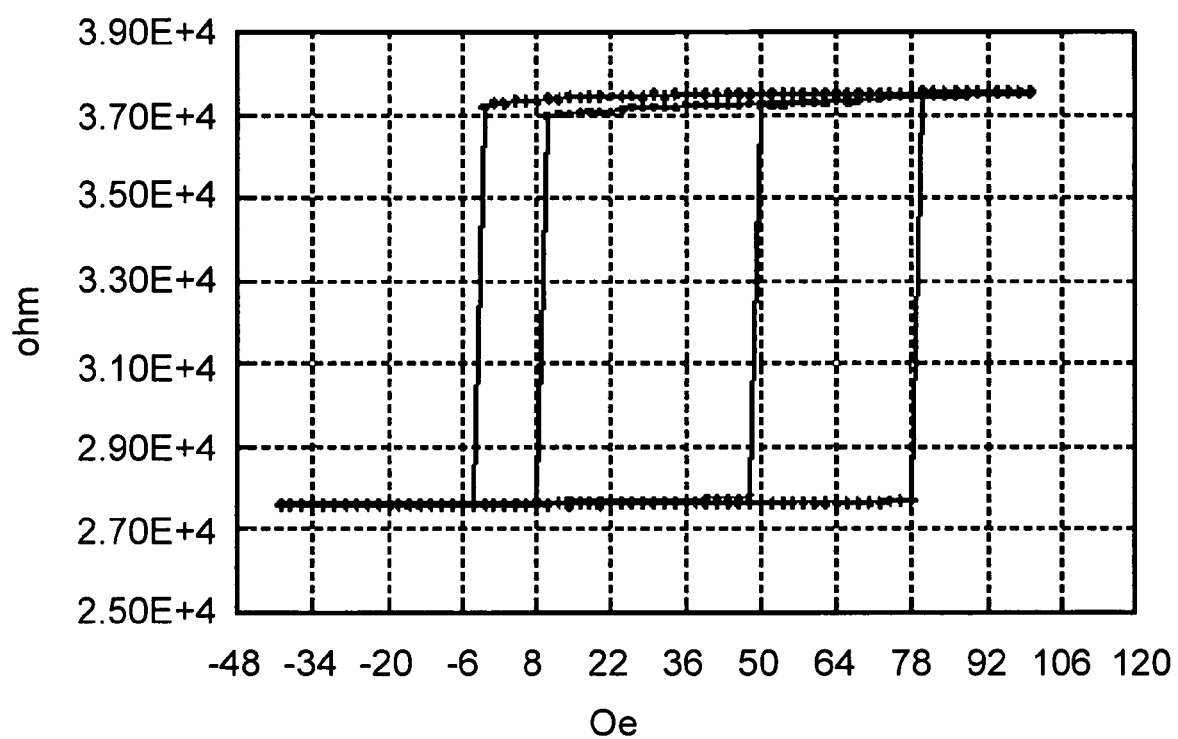
FIG. 4 shows an experimental result of the hysteresis curve of the disclosed MRAM.

A schematic view of the hysteresis curve is shown in FIG. 3. The hysteresis curve of the ferromagnetic free layer without being covered by a multi-layered metal layer is A. The hysteresis curve of the ferromagnetic free layer covered by a multi-layered metal layer is B. Comparing these two curves, one sees that the one with the covering multi-layered metal layer can reduce the switching field of the ferromagnetic free layer. The assumption in FIG. 3 and experimental results in FIG. 4 agree with each other.

Figure 5:
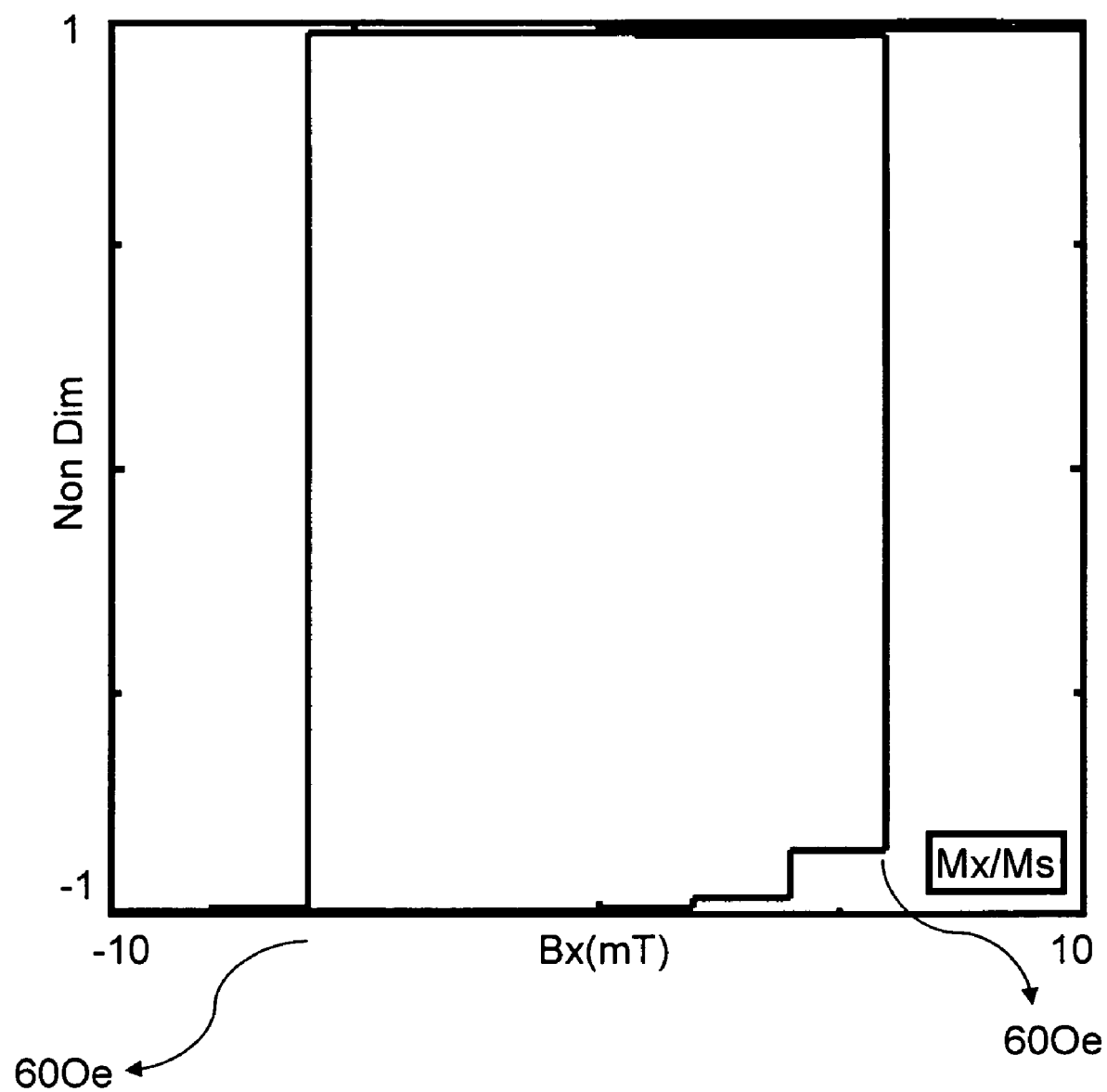
FIG. 5 shows a simulated hysteresis curve or a ferromagnetic free layer without being covered by a multi-layered metal layer in the disclosed MRAM.
Figure 6:
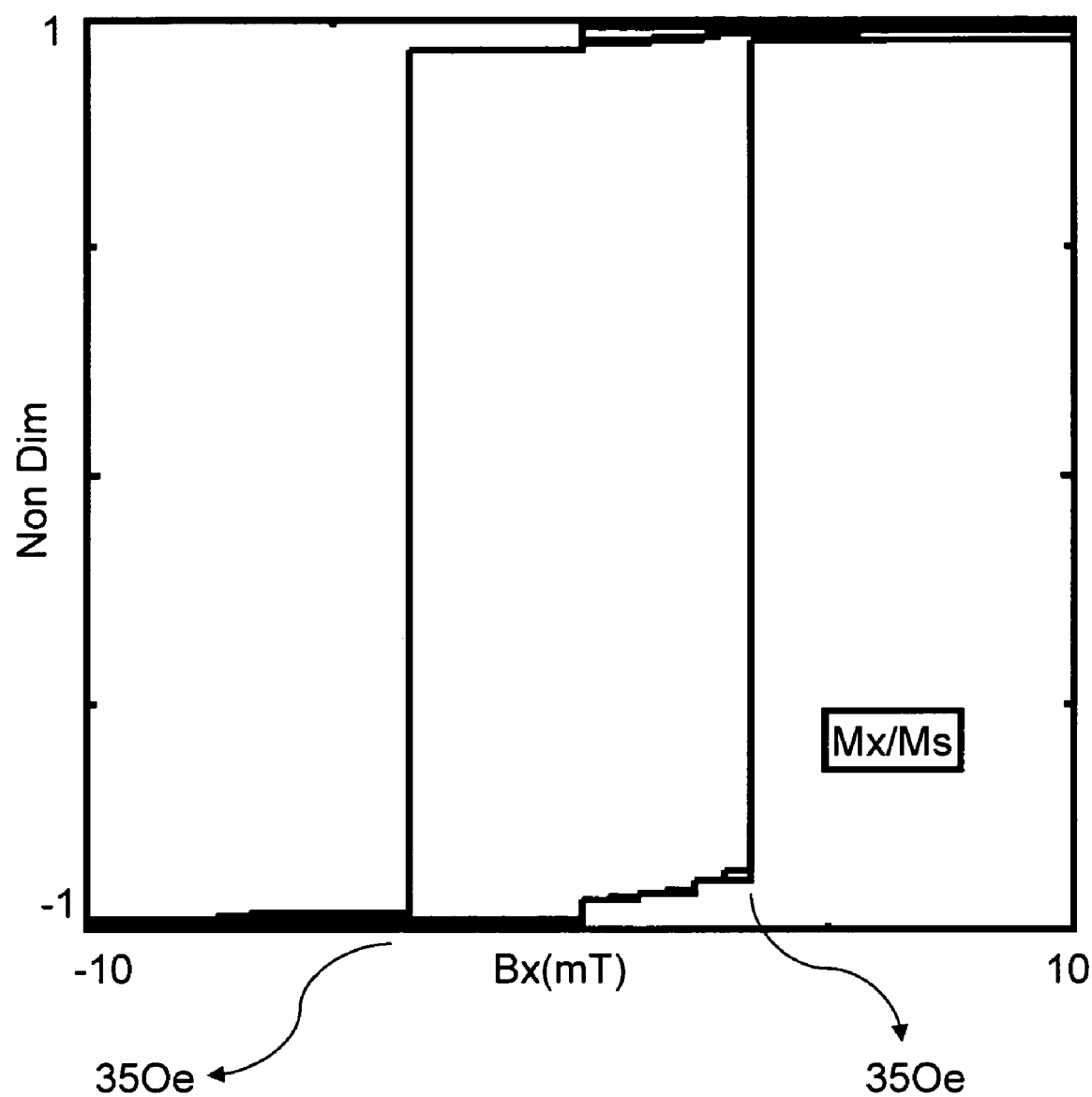
FIG. 6 shows a simulation result of hysteresis on a ferromagnetic free layer covered by a multi-layered metal layer in the disclosed MRAM.

Using a 0.6×0.36 um$^2$ unit cell for a micromagnetic simulation, the hysteresis curve of the ferromagnetic free layer without being covered by a multi-layered metal layer is shown in FIG. 5. The hysteresis curve of the ferromagnetic free layer covered by a multi-layered metal layer is shown in FIG. 6. One easily sees that the required switching field gets smaller.

The disclosed MRAM with a lower switching field has the advantage of lowering the switching field of the ferromagnetic free layer, thereby reducing the required data write-in current.

Certain variations would be apparent to those skilled in the art, which variations are considered within the spirit and scope of the claimed invention.

What is claimed is:

1. A magnetic random access memory (MRAM) with a lower switching field, comprising:
    a first antiferromagnet layer;
    a pinned layer formed on the first antiferromagnet layer;
    a tunnel barrier layer formed on the pinned layer;
    a ferromagnetic free layer formed on the tunnel barrier layer; and
    a multi-layered metal layer formed on the ferromagnetic free layer;
    wherein the multi-layered metal layer contains at least a ferromagnetic layer and an antiferromagnetic layer and the anisotropy axis of the ferromagnetic layer is orthogonal to the anisotropy axis of the ferromagnetic free layer.

2. The MRAM with a lower switching field of claim 1, wherein the multi-layered metal layer comprises:
    a non-magnetic metal layer;
    a ferromagnetic layer formed on the non-magnetic metal layer; and a second antiferromagnet layer formed on the ferromagnetic layer.

3. The MRAM with a lower switching field of claim 2, wherein the anisotropy axis of the ferromagnetic layer is orthogonal to the anisotropy axis of the ferromagnetic free layer.

4. The MRAM with a lower switching field of claim 2, wherein the non-magnetic metal layer is made of a non-magnetically conductive material.

5. The MRAM with a lower switching field of claim 2, wherein the ferromagnetic layer is made of a ferromagnetic material.

6. The MRAM with a lower switching field of claim 2, wherein the second antiferromagnetic layer is made of an antiferromagnetic material.

* * * * *